United States Patent [19]

Quan

[11] Patent Number: 4,490,775
[45] Date of Patent: Dec. 25, 1984

[54] UNIVERSAL PROGRAMMABLE INTERFACE

[75] Inventor: Wing C. Quan, Waldwick, N.J.

[73] Assignee: Westinghouse Electric Corp., Pittsburgh, Pa.

[21] Appl. No.: 381,257

[22] Filed: May 24, 1982

[51] Int. Cl.$^3$ .............................................. H05K 1/18
[52] U.S. Cl. ................................... 361/406; 361/400; 361/413; 361/426
[58] Field of Search ............... 361/400, 406, 413, 426, 361/412, 415; 339/17 LM, 17 LC, 17 M

[56] References Cited

U.S. PATENT DOCUMENTS

| | | | |
|---|---|---|---|
| 3,488,619 | 1/1970 | Weld | 339/17 LC |
| 3,644,792 | 2/1972 | Fields | 361/406 X |
| 3,668,476 | 6/1972 | Wrabel et al. | 361/413 |
| 3,993,935 | 11/1976 | Phillips et al. | 361/413 X |
| 4,001,797 | 1/1977 | Buss et al. | 361/426 X |
| 4,039,902 | 8/1977 | Lacan et al. | 361/400 X |
| 4,179,172 | 12/1979 | Godsey et al. | 361/413 X |

FOREIGN PATENT DOCUMENTS 54-23302 2/1979 Japan ................................... 361/415

OTHER PUBLICATIONS

Korosec et al., Programmable Connector, IBM Tech. Disc. Bull., vol. 15, #3, Aug. 1972, pp. 865 & 866.

Primary Examiner—R. R. Kucia
Attorney, Agent, or Firm—D. R. Lackey

[57] ABSTRACT

A universal, programmable interface for interconnecting printed circuit boards and discrete wires. Standard card-edge connectors and standard cables interconnect one or two bytes of i/o signals between the pc boards and the programmable interface, with the interface being programmed by jumpers to interconnect the desired contact fingers of the interface with screw-type terminations for receiving discrete wires.

4 Claims, 8 Drawing Figures

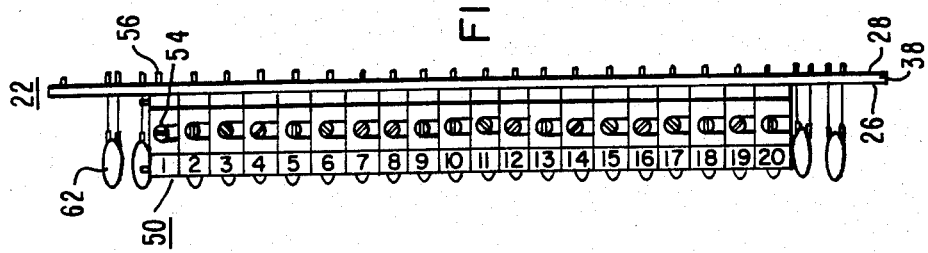
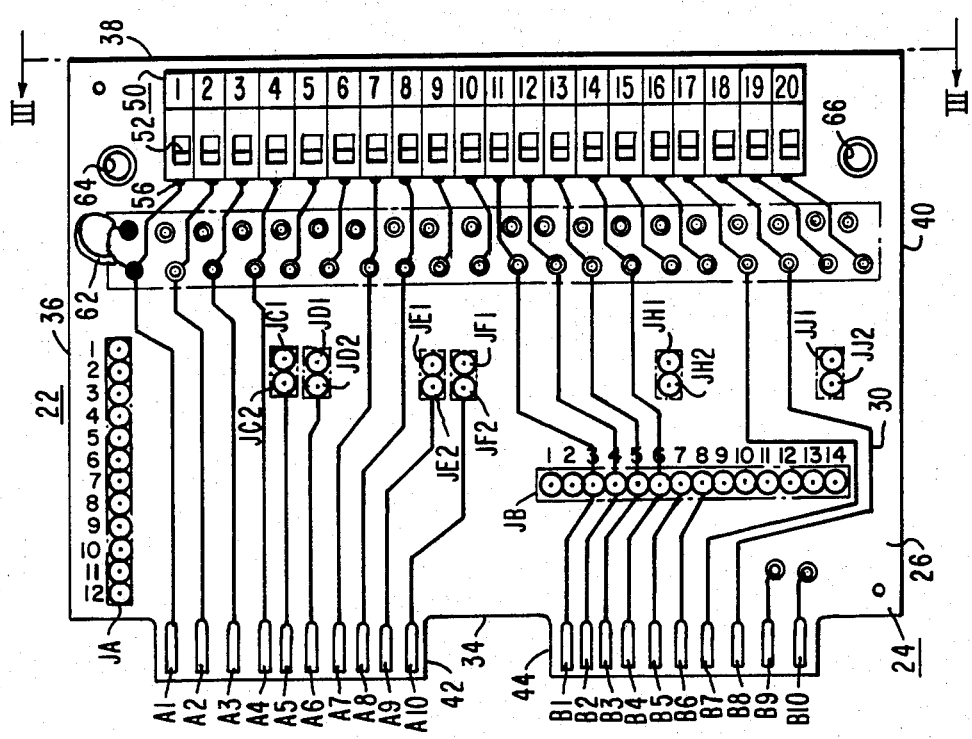

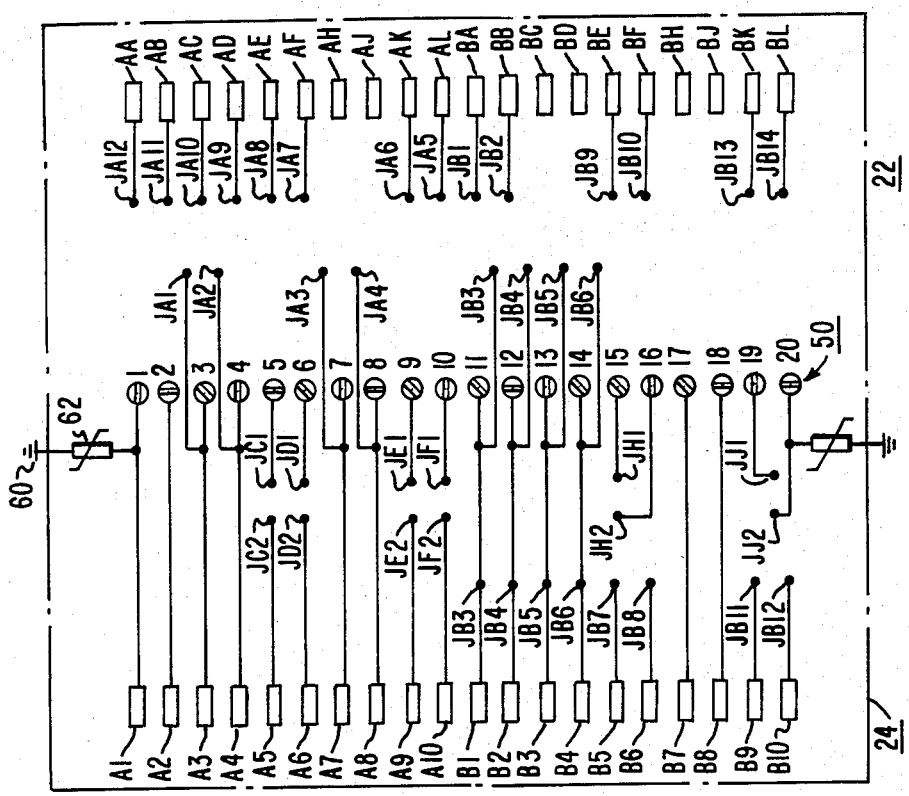
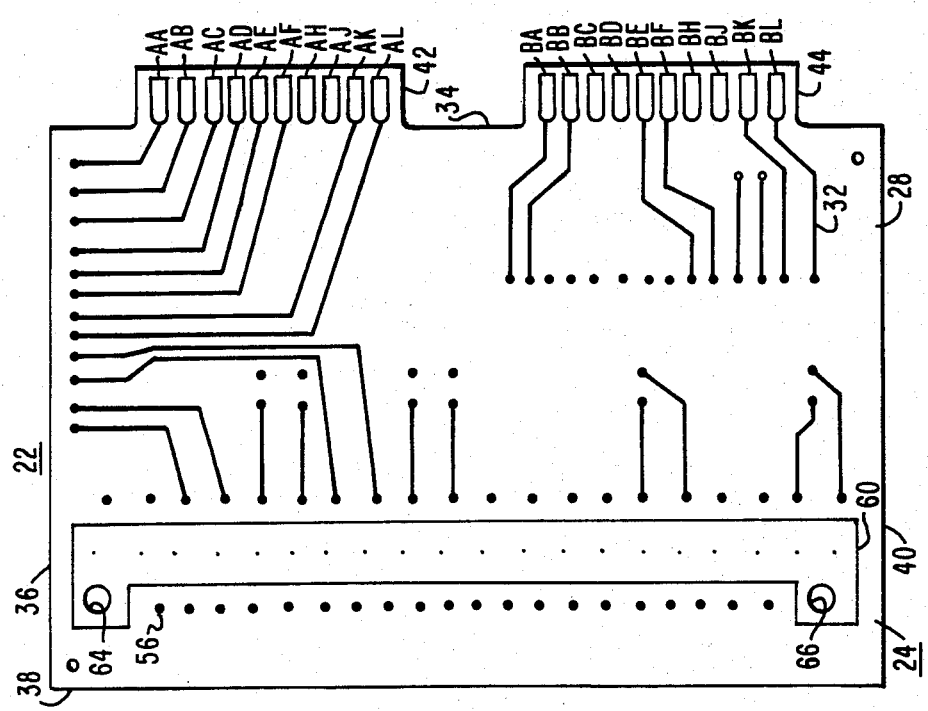
FIG. 4
FIG. 2

UNIVERSAL PROGRAMMABLE INTERFACE

BACKGROUND OF THE INVENTION

1. Field of the Invention

The invention relates to a universal, programmable interface which provides a transition between a printed circuit board and discrete wires.

2. Description of the Prior Art

Many different electrical control and applications, such as those which utilize microprocessors, and the like, have a large plurality of input and output signals to be translated between printed circuit (pc) boards and discrete conductors or wires. An elevator system is a good example, having a large plurality of car call and hall call pushbuttons, and other switches, which generate input signals for the car controller and supervisory control. The control generates output signals for controlling the pushbutton lamps, hall lanterns, the door operator for the elevator car, and the like. The interface between the discrete wires of the input/output (i/o) signals and the pc boards usually includes barrier terminal strips having screw-type terminations for clamping the conductive portions of the discrete wires. A multi-conductor cable having a card-edge connector on one end is engaged with the contact fingers of a pc board, and the other ends of the wires are individually soldered to the backside of the terminal strip. This is a laborious hand soldering job, especially in a system with a large amount of i/o signals.

SUMMARY OF THE INVENTION

Briefly, the present invention is a new and improved universal programmable interface board which may be easily manufactured using the production techniques of standard pc boards. Each interface board includes contact fingers on each of its two major surfaces for receiving standard card-edge connectors, and a barrier terminal strip, which is soldered to conductive traces of the interface board, for terminating individual i/o wires. The interface board also includes programming means, such as a plurality of programming pins. The programming means enables the board to be quickly and easily programmed using plug-in jumpers, wire-wrapping, or the like, according to the particular interface function to be served.

In a preferred embodiment, the contact fingers are arranged in groups of N, arranged N/2 per major surface. The barrier terminal strip has N terminals. The programming means is arranged to enable the contact finger of a single group to be connected to the terminal strip, to terminate a single card-edge connector; or, to enable up to N contact fingers to be selected from different groups to terminate more than one card-edge connector. By selecting N to be twenty, for example, the interface board can translate two eight-bit bytes of input signals from the terminal strip to two card-edge connectors each having standard ten conductor cable. It can also translate one byte of output signals, with each of the eight signals having two associated signals, from a standard twenty conductor cable and associated card-edge connector engaged with one of its dual sided card-edge connection points, to the terminal strip.

BRIEF DESCRIPTION OF THE DRAWINGS

The invention may be better understood, and further advantages and uses thereof more readily apparent, when considered in view of the following detailed description of exemplary embodiments, taken with the accompanying drawings in which:

FIG. 1 is a plan view of the component side of a universal, programmable interface board constructed according to the teachings of the invention;

FIG. 2 is a plan view of the remaining major side of the interface board shown in FIG. 1, which side is devoid of components in order to enable the use of wave or flow soldering;

FIG. 3 is an end view of the interface board shown in FIGS. 1 and 2, taken in the direction of arrows III—III in FIG. 1;

FIG. 4 is a schematic diagram of the interface board shown in FIGS. 1, 2 and 3;

DESCRIPTION OF PREFERRED EMBODIMENTS

Figure 5:
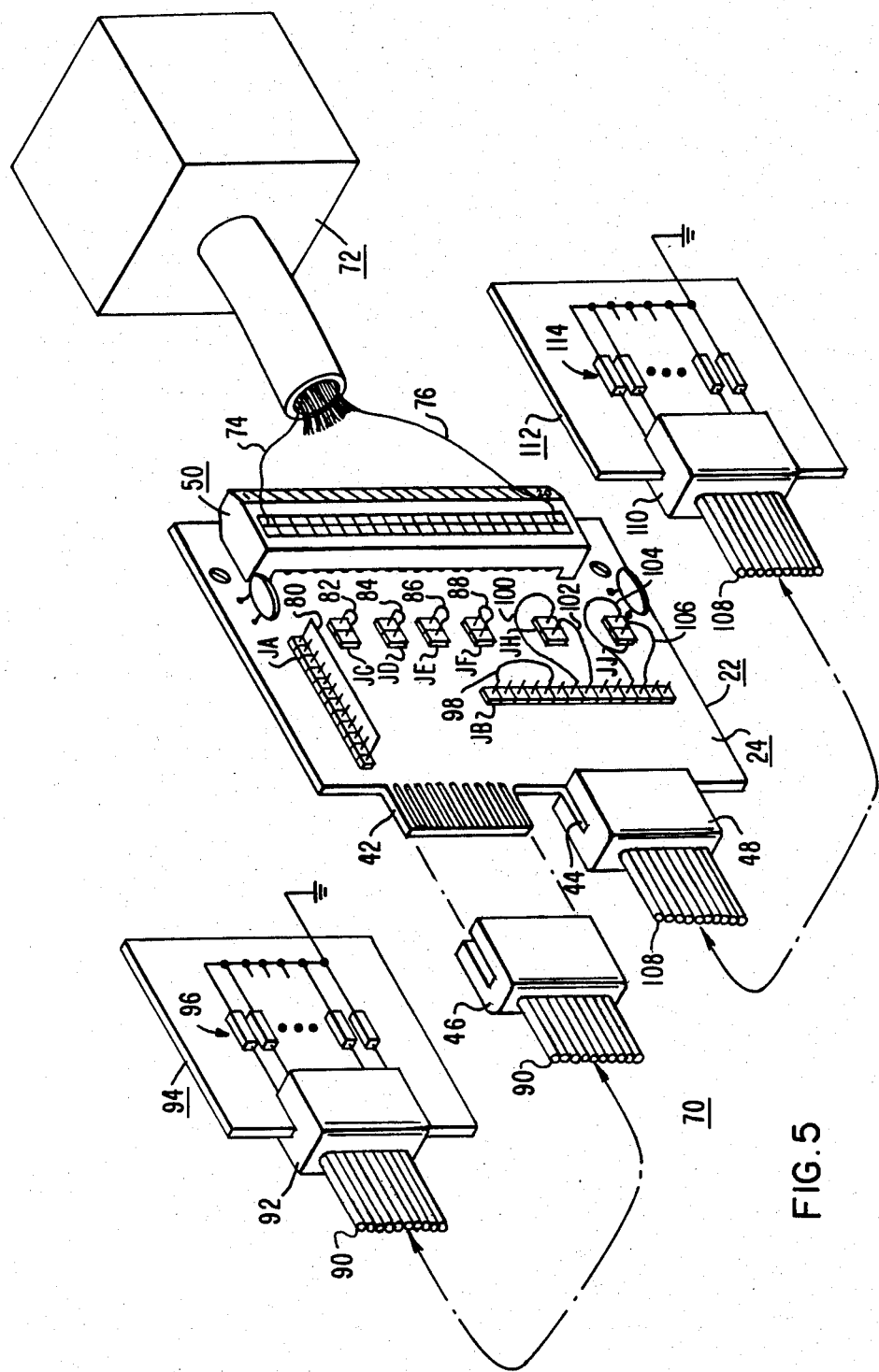
FIG. 5 is a perspective view of an interface assembly illustrating the translation of two bytes of input signals from discrete wires associated with electrical apparatus, to two pc boards via the programmable interface board of the invention.

Referring now to the drawings, and to FIGS. 1, 2, 3 and 4 in particular, there is shown a new and improved universal, programmable interface board or wiring terminator 22 constructed according to the teachings of the invention. FIGS. 1 and 2 are views of opposite major surfaces of board 22, while FIG. 3 is an edge view of board 22 taken between and in the direction of arrows III—III in FIG. 1. FIG. 4 is a schematic diagram of the board 22 shown in FIGS. 1, 2 and 3. The function of board 22 is to interconnect one or more bytes of input/output (i/o) signals from a printed circuit (pc) or printed wiring (pw) board or card-edge to a screw-type termination.

More specifically, interface board 22 is a double-sized printed circuit (pc) board comprising a relatively thin dielectric sheet or substrate 24 having first and second major opposed surfaces 26 and 28, respectively. The thickness dimension of sheet 24 may be about 1 to 2 mm, for example. Surfaces 26 and 28 each have printed circuits or conductive traces bonded thereto, such as traces 30 and 32, respectively. Traces 30 and 32 are generally formed with copper, but other good electrical conductors may be used, if desired. Sheet 24 is generally rectangular in configuration, having edges 34, 36, 38 and 40. It will be mounted on a suitable metallic support plate (not shown), which plate is dimensioned for mounting in a conventional pc card cage, along with a plurality of pc boards associated with the specific control function which requires an interface between pc boards and discrete wires.

Edge 34 of sheet 24, which will face the rear of the card cage when installed therein, includes first and second portions 42 and 44, respectively, configured to receive first and second plug-in card-edge connectors, such as connectors 46 and 48, respectively, shown in FIG. 5. Each portion 42 and 44 includes a plurality of electrically conductive contact fingers bonded to the surfaces of the sheet and connected to predetermined circuit traces on each major surface or side of sheet 24. For example, portion 42 includes 10 contact fingers A1 through A10 on major surfaces 26, adjacent to edge 34, and 10 contact fingers AA, AB, AC, AD, AE, AF, AH, AJ, AK and AL, all on major surface 28 adjacent to edge 34. The contact fingers of the two major surfaces are arranged in pairs to provide 10 dual contact positions, with contact fingers A1 and AA defining a first pair, etc.

In like manner, portion 44 includes 10 contact fingers B1 through B10 on major surface 26, adjacent to edge 34, and 10 contact fingers BA, BB, BC, BD, BE, BF, BH, BJ, BK and BL on major surface 28, adjacent to edge 34.

The contact fingers of portions 42 and 44 provide the interface points between interface board 22 and the pc boards to be communicated with, with electrical circuits at this interface point being in the two major, flat planes occupied by major surfaces 26 and 28.

Components of interface board 22 which are soldered to the circuit traces are all mounted on a single common side of sheet 4, such as on major surface 26, in order to facilitate production line soldering, such as wave soldering. One such component is a barrier terminal strip or terminal block 50 which may be a 20-position strip having a wire clamp and screw actuator at each position, such as wire clamp 52 and screw actuator 54 at position No. 1. Each wire clamp is connected to a conductor which is soldered to a circuit trace, such as conductor and solder point 56 associated with terminal position No. 1. Thus, interface board 22 translates the two planes of electrical circuits from or to external pc boards, to a single plane which has a plurality of in-line terminals for quick connection to discrete wires which communicate i/o signals between the pc boards and associated external electrical apparatus.

One byte of input signals may include eight bits plus a ground circuit, and thus interface board 22, with its 20 positions, can accommodate two bytes of input signals. For example, the input signals may be provided by car call and hall call pushbuttons of an elevator system, and thus each signal may be provided by a terminal on one side of the pushbutton or actuator, and ground on the other side. One byte of output signals, on the other hand, may require two bits for each output signal, for a total of 16 bits for eight signals. Thus, board 22 can handle two bytes of input signals, or one byte of output signals, as desired. Programming means on interface board 22 enables board 22 to utilize a single card-edge connector with a 20 conductor cable, or to utilize first and second card-edge connectors, each associated with a ten conductor cable. The programming means includes a plurality of electrically conductive pins mounted on sheet 24, which have first ends soldered to predetermined circuit traces on the two major surfaces 26 and 28, and second ends which are all accessible for programming connections on the component side adjacent to major surface 26. The programming pins, which, for example, may be those sold under the tradename BERG STIK, may include a 12 position programming strip JA, a 14 position programming strip JB, and 6 dual position programming strips JC, JD, JE, JF, JH and JJ.

An exemplary programming arrangement is set forth in the figures. It is to be understood that different programming arrangements may be used, with the programming arrangement illustrated being a preferred embodiment. For example, contact fingers A1 through A4, A7 and A8 may be directly connected to terminals 1 through 4, 7 and 8, respectively of terminal strip 50, by appropriate circuit traces, while contact fingers A5, A6, A9 and A10 are connected to the No. 2 pins of dual strips JC, JD, JE and JF. The No. 1 pins of these programming strips are connected to terminals 5, 6, 9 and 10 of terminal strip 50.

Referring now to the second major surface 28 of sheet 24, eight of the contact fingers of portion 42 are connected to different pins of programming strip JA. For example, fingers AA, AB, AC, AD, AE and AF may be connected to pin Nos. 12 through 7, respectively, while fingers AK and AL may be connected to pin Nos. 6 and 5, respectively. The four remaining pins, 1, 2, 3 and 4 of programming strip JA are connected to terminals 3, 4, 7 and 8, respectively, of terminal strip 50. This completes the first portion 42.

Contact fingers B1 through B6, B9 and B10 are connected to pins 3 through 8, 11 and 12, respectively, of programming strip JB, with fingers B1 through B4 additionally being connected to terminals 11 through 14, respectively, of terminal strip 50. Contact fingers B7 and B8 are connected to terminals 17 and 18, respectively, of terminal strip 50. Referring now to the second major surface 28, contact fingers BA, BB, BE, BF, BK and BL are connected to programming pins 1, 2, 9, 10, 13 and 14, respectively, of programming strip JB. Pin Nos. 1 and 2 of programming strip JH are connected to terminals 15 and 16, respectively, of terminal strip 50, and pin Nos. 1 and 2 of programming strip JJ are connected to terminals 19 and 20, respectively, of terminal strip 50.

To complete interface board 22, terminals 1 through 20 of terminal strip 50 may each be connected to a ground strip 60 on the second major surface 28 via a varistor, such as the varistor 62 shown connecting terminal 56 to ground 60. The remaining varistors are only illustrated in FIG. 3, in order to simplify the drawing. Any spikes on the signals connected to terminal strip 50 which exceed a predetermined magnitude will be shunted to ground 60, to protect the pc board circuits connected to the contact fingers. Openings 64 and 66 through sheet 24, and through the ground strip 60, may be plated and used to simultaneously mount interface board 22 on a metallic mounting plate, and to connect ground strip 60 to the metallic mounting plate, which is also grounded.

Figure 6:
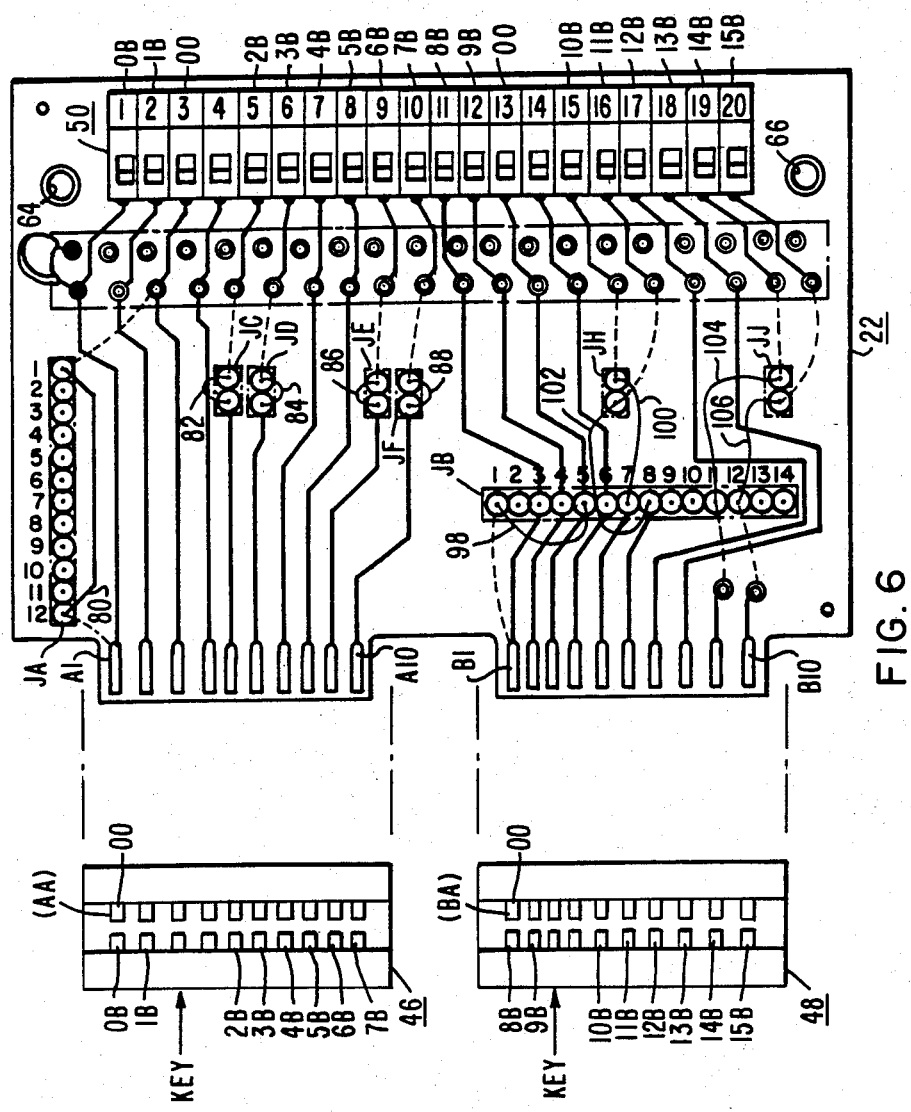
FIG. 6 is a plan view of the component and programming side of the interface board, and end views of the associated card-edge connectors, shown in FIG. 5, which illustrates the programming required to translate the indicated signals from the terminal strip to the conductors of the two card-edge connectors.

The use and versatility of board 22 may best be illustrated by describing its use in a new and improved interface assembly, with a first interface assembly 70 being shown in FIGS. 5 and 6. This embodiment illustrates the use of board 22 as an interface for two bytes of input signals. FIG. 5 is a perspective view of interface assembly 70, and FIG. 6 illustrates a plan view of board 22 and end views of the associated card-edge connectors 46 and 48 which are plugged into board 22. The electrical apparatus providing the input signals is shown generally at 72, which, for purposes of example, will be assumed to be an elevator system providing signals from 16 pushbuttons such as car call pushbuttons, and/or hall call pushbuttons. The signals are referenced 0B through 15B, with the common or ground side of each signal being referenced 00. The individual or discrete wires associated with signals 0B through 15B, such as wires 74 and 76 associated with signals 0B and 15B, respectively, are connected to predetermined terminals of the terminal strip 50, which may be pre-marked to illustrate which terminal each signal wire should be connected to. Using the edge connector formats shown in FIG. 6, where the third dual position, counting from the top, is used for keying, and the fourth position is a spare position, signals 0B through 7B may be connected to terminals 1, 2 and 5–10, respectively, and the associated ground lead 00 may be connected to terminal 3. In like manner, signals 8B through 15B may be connected to terminals 11, 12 and 15–20, while the associated ground lead 00 may be connected to terminal 13. Board 22 is programmed by connecting a jumper 80 from pin 1 to pin 12 of programming strip JA. This will connect terminal 3 of terminal strip 50, to which the ground conductor 00 is connected, to contact finger AA. Jumpers 82, 84, 86 and 88 are applied to interconnect the two pins associated with each of the programming strips JC, JD, JE and JF. Thus, signals 0B–07 appear at the contact fingers A1, A2 and A5–A10, respectively, and they will also be connected to the indicated conductors of card-edge connector 46. Card-edge connector 46 may be connected to a standard 10 conductor ribbon or multi-conductor cable 90. The other end of cable 90 is connected to a card-edge connector 92, which is plugged into a pc board 94. PC board 94 may include an opto-isolator or photo coupler for each signal bit 0B through 7B, such as shown generally at 96. When a pushbutton is actuated in electrical apparatus 72, an associated LED on board 94 is energized, which in turn energizes a photo transistor to provide an input signal for the associated microprocessor, or the like.

Board 22 is further programmed by connecting a jumper 98 from pin 1 to pin 5 of programming strip JB. This connects terminal 13 of terminal strip 50, and thus the ground lead 00, to contact finger BA. To complete the programming, a jumper 100 connects pin No. 1 of programming strip JH to pin 7 of programming strip JB, a jumper 102 connects pin No. 2 of strip JH to pin 8 of strip JB, a jumper 104 connects pin No. 1 of strip JJ to pin 11 of strip JB, and a jumper 106 connects pin No. 2 of strip JJ to pin No. 11 of strip JB. Thus, signals 8B–15B appear at contact fingers B1, B2 and B5–B10, respectively, and also at the indicated conductors of card-edge connector 48. Card-edge connector 48 may be connected to a standard 10 conductor ribbon or multiconductor cable 108, and its other end is connected to a card-edge connector 110, which is plugged into a pc board or card 112 having components 114, which may be similar to components 96.

Figure 7:
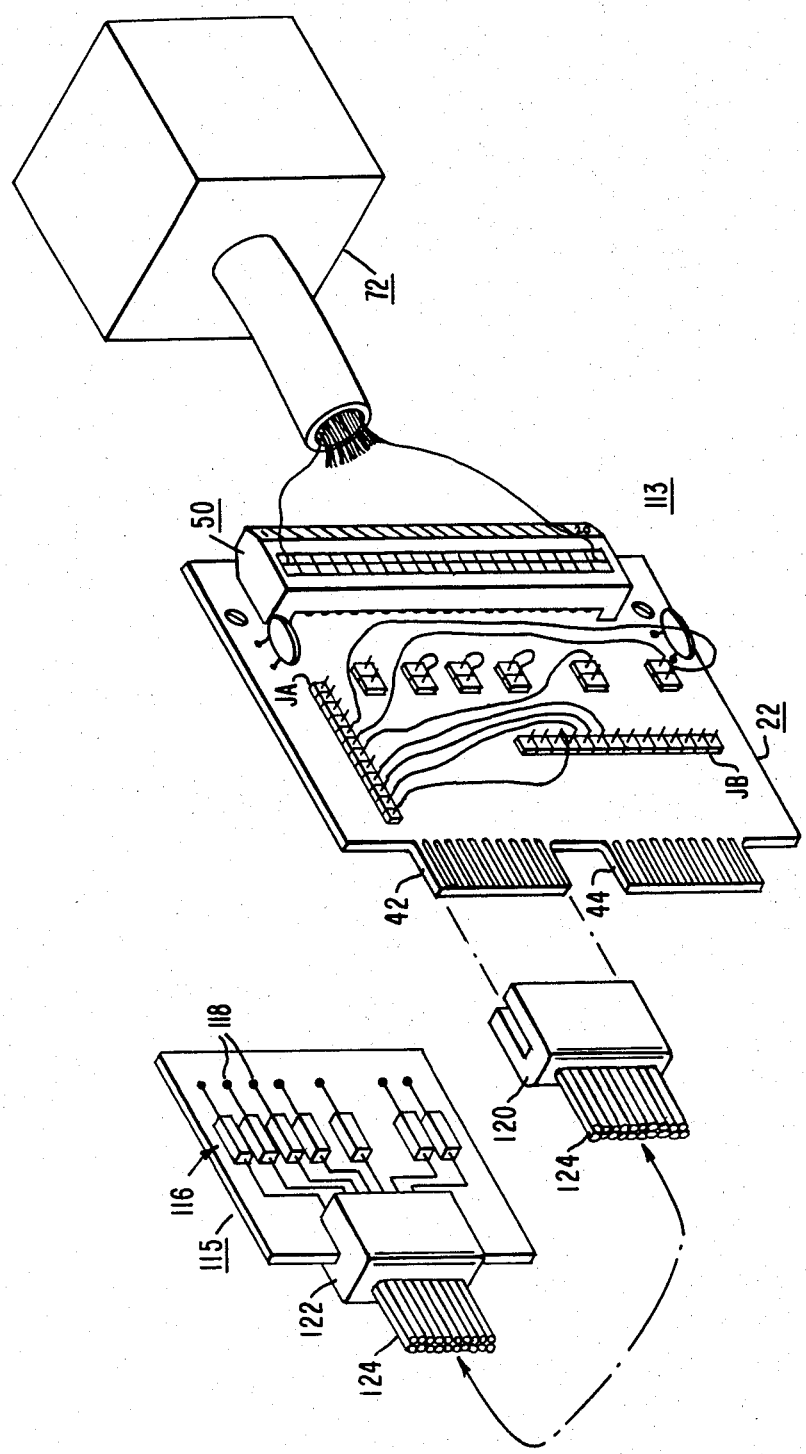
FIG. 7 is a perspective view of an interface assembly illustrating the translation of the signals associated with one byte of output signals from a pc board to electrical apparatus via a terminal strip.
Figure 8:
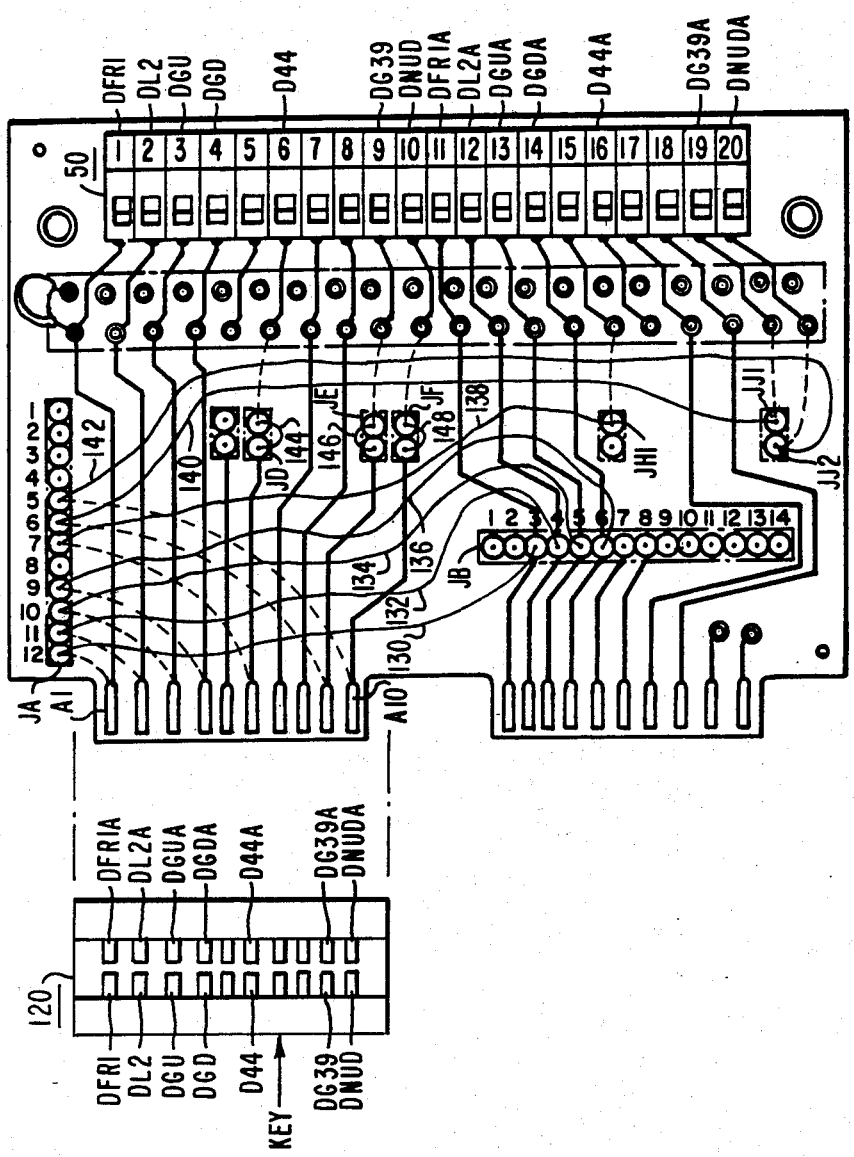
FIG. 8 is a plan view of the component and programming side of the interface board, and an end view of the card-edge connector, shown in FIG. 7, which illustrates the programming required to translate the indicated signals from the card-edge connector to the terminal strip.

FIGS. 7 and 8 illustrate the use of board 22 in an interface assembly 113 for translating one byte of output signals from a pc board 115 to electrical apparatus 72. FIG. 7 is a perspective view of assembly 113, and FIG. 8 is a plan view of board 22 and an end view of an associated card-edge connector 120, which is plugged into board 22. PC board 115 may have a plurality of opto-isolators 116 which produce a closed or complete circuit when the associated microprocessor or control wishes to send an associated output signal. One end of each opto-isolator 116 is connected to a contact finger on one side of pc board 115, and the other end of the opto-isolator is connected to a like positioned contact finger on the other side of the pc board via plated through holes 118. A card-edge connector 112 is plugged into board 115, and a standard 20 conductor cable 124 interconnects card-edge connectors 122 and 120. In this embodiment, only portion 42 of board 22 is used, with portion 44 being free of a card-edge connector.

If the output signals are applied to card-edge connector 120 as shown in FIG. 8, and it is desired to output these signals at the terminals of strip terminal 50 according to the format shown in FIG. 8, the programming of board 22 would be as follows: jumpers 130, 132, 134 and 136 have first ends connected to pins 12, 11, 10 and 9, respectively, of programming strip JA, and they have second ends connected to pins 3, 4, 5 and 6, respectively, of programming strip JB; jumpers 138, 140 and 142 have first ends connected to pins 7, 6 and 5, respectively, of programming strip JA and they hve second ends connected to pin No. 1 of strip JH, pin No. 1 of strip JJ, and pin No. 2 of strip JJ; and, jumpers 144, 146 and 148 disposed to interconnect the two pins of each of the programming strips JD, JE and JF, respectively.

In summary, there has been disclosed a new and improved universal, programmable interface board which eliminates a laborious hand soldering job for communicating i/o signals between pc boards and screw type terminators which terminate discrete wires. The programmable interface board may be used with one or more card-edge connectors, it can be used for input or output signals, and it can be quickly programmed by simple jumper plugs, or the like, to adapt the interface board to the specific function it is required to implement. While signals appear at the contact fingers on both major surfaces of the programmble interface board, the board has components mounted on only one side thereof, including a screw-type termination for discrete wires having a plurality of in-line terminals.

I claim as my invention:
1. A universal, programmable interface assembly, comprising:
   electrical apparatus having a plurality of discrete conductors,
   a first multiconductor cable terminated by first and second card-edge connectors,
   at least one printed circuit board having circuits to be connected to said electrical apparatus, said at least one printed circuit board having a plurality of contact fingers connected to said circuits, with the first card-edge connector of said cable being engaged with said contact fingers,
   a programmable printed circuit board having first and second major opposed surfaces, contact fingers on both major surfaces, with the second card-edge connector of said cable being engaged with at least certain of said contact fingers, circuit traces on both major surfaces connected to said contact fingers, a barrier terminal strip on the first major surface having conductors and associated terminals, with said conductors being connected to predetermined circuit traces on both major surfaces, and with the discrete conductors of said electrical apparatus being connected to said terminals, programming pins on the first major surface connected to circuit traces on both major surfaces, and means electrically interconnecting predetermined programming pins to connect predetermined contact fingers on both major surfaces to the terminals of said terminal strip.

2. The interface assembly of claim 1 including an additional printed circuit board having circuits and associated contact fingers to be connected to the electrical apparatus, and a second multiconductor cable terminated by first and second card-edge connectors, with the first card-edge connector of said second cable being engaged with the contact fingers of said additional printed circuit board, and wherein the contact fingers of said programmable printed circuit board are divided into first and second groups, which are engaged with the second card-edge connectors of the first and second cables, respectively.

3. A programmable wire/pc board interface, comprising:
- a dielectric sheet having first and second major opposed surfaces,
- a plurality of card-edge contact fingers on both surfaces of said sheet arranged in first and second spaced groups adapted to receive first and second pc card-edge connectors, respectively,
- a plurality of wiring pins mounted on said dielectric sheet, accessible for connection from the side adjacent to said first major surface,
- a barrier terminal strip having a plurality of conductors mounted on said dielectric sheet, and a plurality of associated terminals accessible from the side adjacent to said first major surface,
- and circuit conductors bonded to both major surfaces of said dielectric sheet including conductors which interconnect:
  (a) predetermined card-edge contact fingers with predetermined wiring pins,
  (b) predetermined card-edge contact fingers with predetermined conductors of said terminal strip,
  (c) predetermined card-edge contact fingers with predetermined wiring pins and predetermined conductors of said terminal strip, and
  (d) predetermined wiring pins with predetermined conductors of said terminal block, whereby conductors from at least one card-edge connector may be connected to the terminal strip by interconnecting predetermined wiring pins.

4. The interface of claim 3 wherein each of the first and second groups of contact fingers include a predetermined number N of said fingers arranged N/2 per major surface, and the terminal strip includes the same predetermined number N of terminals, with the circuit conductors being connected such that each contact finger of a selected group may each be connected to a different terminal of the terminal strip, to terminate a single card-edge connector, and such that up to N contact fingers selected from both the first and second groups may be connected to a different terminal, to terminate first and second card-edge connectors, by appropriate jumpers connected between predetermined wiring pins of the terminal strip.

* * * * *